United States Patent [19]
Inasaka

[11] Patent Number: 5,364,276
[45] Date of Patent: Nov. 15, 1994

[54] MICROPIN ARRAY AND PRODUCTION THEREOF

[75] Inventor: Jun Inasaka, Tokyo, Japan

[73] Assignee: NEC Corporation, Tokyo, Japan

[21] Appl. No.: 54,834

[22] Filed: Apr. 30, 1993

Related U.S. Application Data

[63] Continuation of Ser. No. 738,135, Jul. 30, 1991, abandoned.

[30] Foreign Application Priority Data

Jul. 30, 1990 [JP] Japan ................... 2-202936

[51] Int. Cl.$^5$ .................... H01R 9/09; H05K 1/11
[52] U.S. Cl. .................... 439/66; 439/68; 439/591; 29/877; 29/878
[58] Field of Search .............. 439/65, 66, 68, 74, 439/83, 591; 29/884, 885, 874, 876–880

[56] References Cited

U.S. PATENT DOCUMENTS

| | | | |
|---|---|---|---|
| 3,852,878 | 12/1974 | Munro | 29/878 |
| 3,893,233 | 7/1975 | Glover | 29/877 |
| 3,954,317 | 5/1976 | Gilissen et al. | |
| 4,330,165 | 5/1982 | Sado | 439/91 |
| 4,999,460 | 3/1991 | Sugiyama et al. | 439/66 |

FOREIGN PATENT DOCUMENTS

| | | |
|---|---|---|
| 0030574 | 6/1981 | European Pat. Off. |
| 0070136 | 1/1983 | European Pat. Off. |
| 0396248 | 11/1990 | European Pat. Off. |
| 62-24916 | 5/1987 | Japan |
| 62-32591 | 7/1987 | Japan |
| 62-32592 | 7/1987 | Japan |
| 63-28515 | 6/1988 | Japan |
| 1505678 | 3/1978 | United Kingdom |

Primary Examiner—P. Austin Bradley
Attorney, Agent, or Firm—Burns, Doane, Swecker & Mathis

[57] ABSTRACT

The micropin array is comprised of a plurality of micropins having a given diameter and being aligned in parallel to one another at a given pitch, insulating tubular coatings disposed to cover individual micropins, and an adhesive provided to fill spacings among the insulating tubular coatings. This micropin array is produced by the steps of preparing a plurality of coated wire materials composed of a metal core having a given diameter and an insulating tubular coating of a given thickness formed around the metal core, aligning closely and successively the coated wire materials to form a bundle thereof, fixing the bundle of the coated wire materials by means of an adhesive, and cutting the fixed bundle of the coated wire materials by a given length to form a micropin array.

5 Claims, 11 Drawing Sheets

MICROPIN ARRAY AND PRODUCTION THEREOF

This application is a continuation, of Application Ser. No. 07/738,135, filed Jul. 30, 1991 now abandoned.

BACKGROUND OF THE INVENTION

The present invention relates to a micropin array and the method of producing the same, and more specifically relates to a set of I/O pins for use as an external connector of a PGA package etc. and the method of producing the same.

Conventionally, in the PGA package of an IC device, there are utilized I/O pins in the form of a set of micropins which are separately and independently fixed to an LSI chip. Such micropins are produced such that a lead wire material is treated by mechanical working such as stamping with header processing to form individual micropins. Namely, the micropins are produced in manner similar to the production method of the typical I/O pins attached to the typical PGA package. There may be other methods such as utilizing photolithographic technology to form chemically the micropins. These methods of producing micropins are disclosed, for example, in Japanese Patent Publication Nos. 62-24916, 62-32591, 62-32592 and 63-28515.

In use of the conventional micropins for electrical connection to an LSI chip, the micropins are individually fixed to the LSI chip in a given alignment pitch, thereby disadvantageously requiring a highly accurate alignment tool. Further, since the micropins are connected to the LSI chip one by one, micropins are easily curved or folded to thereby disadvantageously degrade the mechanical strength of an assembly.

In the conventional method of producing micropins according to the mechanical working, there is practical limitation in diameter and length dimension of micropins due to dimensional error in the header processing. Therefore, it is practically difficult to produce a pin having a diameter less than 0.1 mm.

On the other hand, a fine pin having a diameter less then 0.1 mm can be formed by the photolithographic technology. However, the aspect ratio thereof, i.e., pin length/pin diameter ratio cannot be increased by this method.

SUMMARY OF THE INVENTION

An object of the present invention is to provide a micropin array and the production method thereof, which has sufficient mechanical strength and which is free of deformation such as curving or folding of micropins.

Another object of the present invention is to provide a micropin array and the production method thereof, which has no limitation with respect to pin diameter and pin length dimension and which can ensure a high aspect ratio of an individual pin.

According to the present invention, there can be obtained the micropin array which is comprised of a plurality of micropins having a given diameter and being aligned in parallel to one another at a given pitch, insulating tubular coatings disposed to cover individual micropins, and an adhesive provided to fill spacings among the insulating tubular coatings.

Further, according to the invention, there can be obtained the method of producing a micropin array, comprising the steps of preparing a plurality of coated wire materials composed of a metal core having a given diameter and an insulating tubular coating of a given thickness formed around the metal core, aligning closely and successively the coated wire materials to form a bundle thereof, fixing the bundle of the coated wire materials by means of an adhesive, and cutting the fixed bundle of the coated wire materials by a given length to form a micropin array.

DETAILED DESCRIPTION OF EMBODIMENTS

Figure 1:
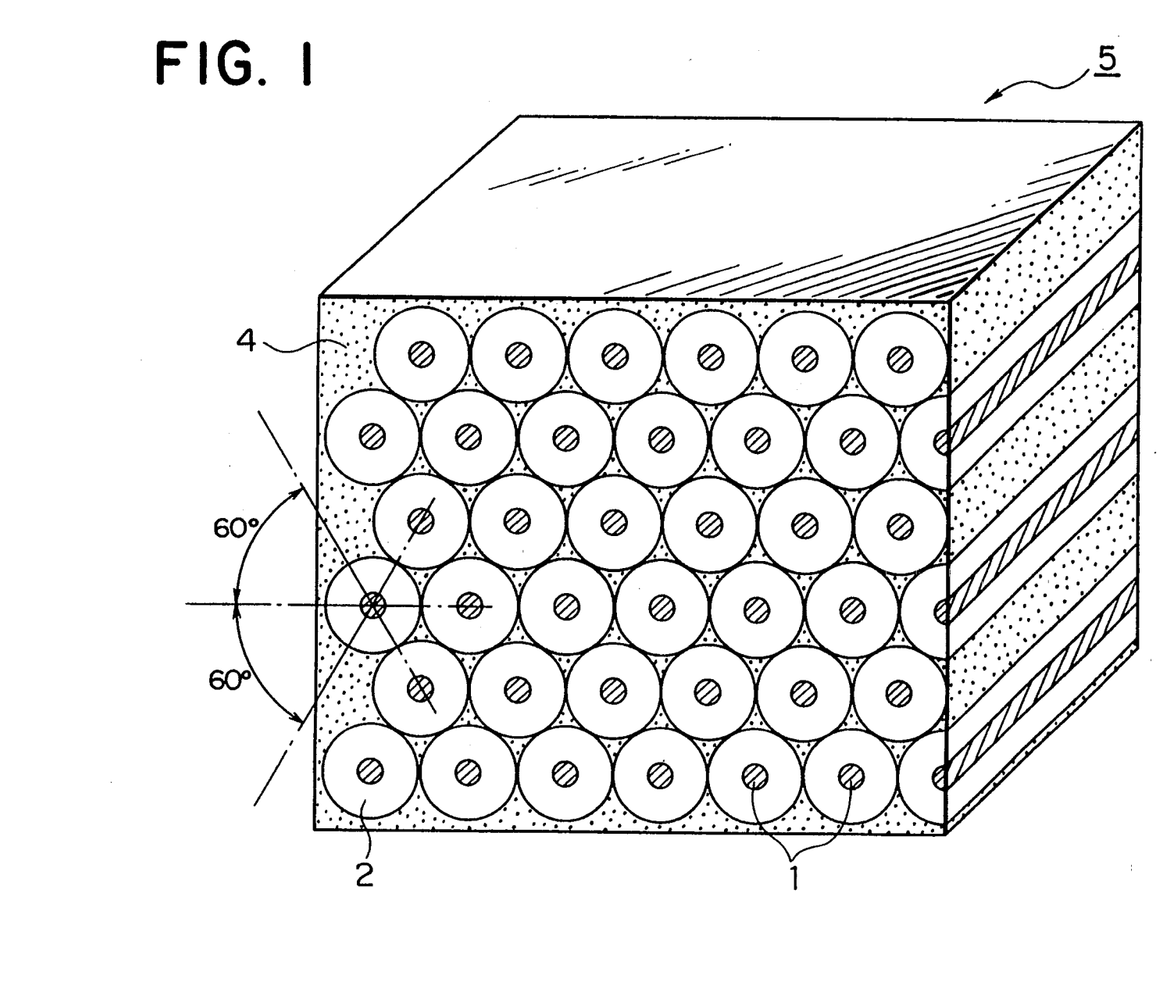
FIG. 1 is a perspective view containing a section of an embodiment of the present invention.

Hereinafter, preferred embodiments of the present invention will be described in detail with reference to the drawings. FIG. 1 is a perspective view containing a section of one embodiment according to the present invention. A plurality of micropins 1 having a given diameter and a length are arranged in parallel to one another at a constant interval or pitch. Each micropin 1 is covered by an electrically insulating tubular coating 2. An adhesive 4 is provided to fill spacings or gaps among the insulating tubular coatings 2 such that the plurality of micropins 1 are fixed to one another by the adhesive 4 to form a micropin array 5.

In this embodiment, all of the insulating tubular coatings 2 have the same diameter so that the micropins are aligned in the horizontal direction along a line connecting between sectional centers of adjacent micropins. Further, adjacent three micropins are disposed at respective vertices of an equilateral triangle which connects among sectional centers of the three adjacent micropins to form a lattice having a given pitch.

Figure 2:
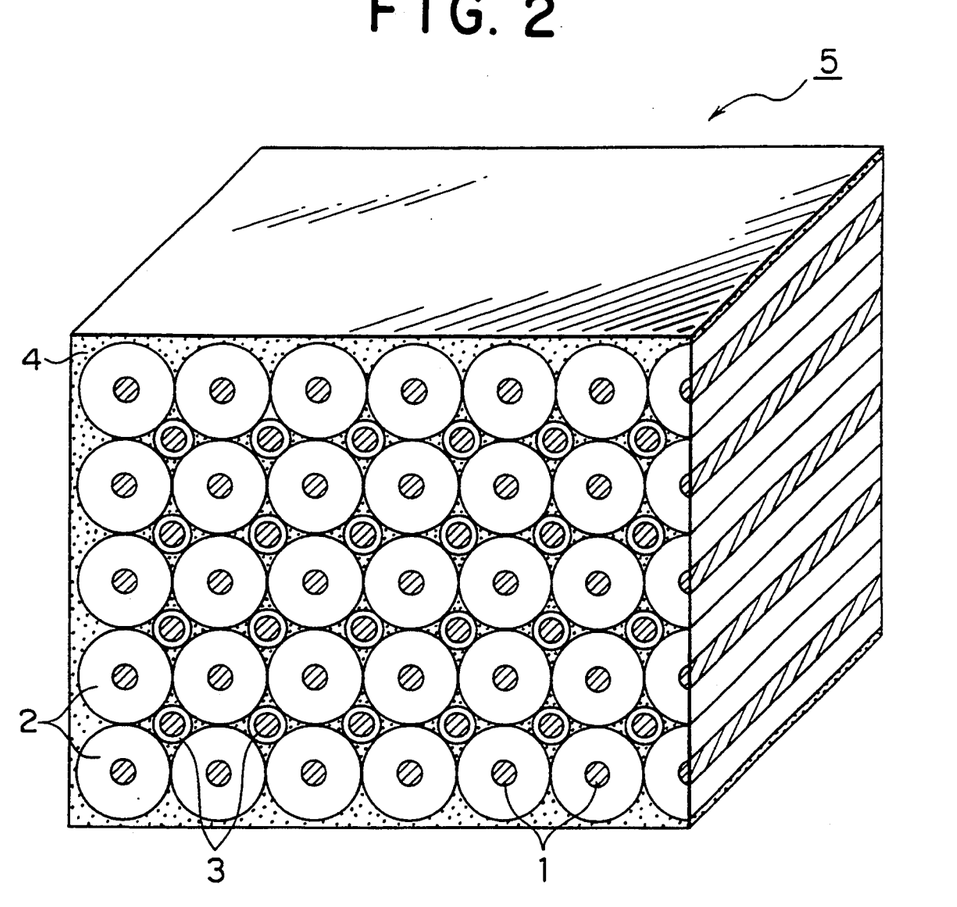
FIG. 2 is a perspective view containing a section of another embodiment of the invention.
Figure 3:
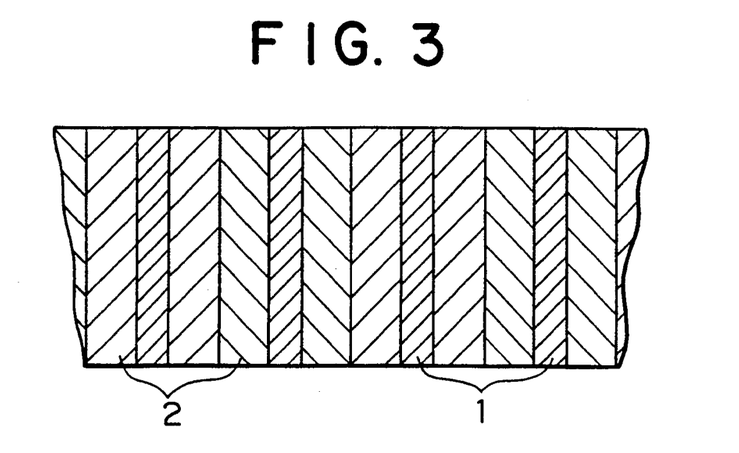
FIG. 3 is a vertical side section of the FIG. 2 micropin array.

FIG. 2 is a perspective view containing a section of another embodiment of the present invention, and FIG. 3 is a vertical side section viewed from its side. In this embodiment, the array is comprised of horizontally aligned lows of micropins, vertically aligned columns of micropins, and additional micropins each being surrounded by adjacent four micropins of the rows and columns such that the sectional center of the additional micropin is disposed in registration with a center of a square shape which connects among sectional centers of the four adjacent micropins. Namely, each micropin having a thinner insulating coating 3 is disposed in a spacing surrounded by thicker insulating coatings 2 of four adjacent micropins aligned in rows and columns, such that the sectional centers of the respective micropins 1 are aligned to form a staggered lattice. In this embodiment, the micropin 1 is composed of a typical pin material such as Kovar and copper alloy used typically in a pin grid array. The micropin 1 has a 100 μm of diameter, 2.0 mm of length so that the micropins are aligned in a staggered lattice having 400 μm of pitch. This alignment pitch corresponds to a pad pitch of LSI chip which is connected to an external circuit through the micropin array. The individual micropins 1 are covered by two kinds of the tubular electrically insulating coatings 2 and 3 having different film thicknesses. These electrically insulating coatings 2 and 3 are made of, for example, polyimide resin, and their film thickness is determined according to the alignment pitch of the micropins 1.

Figure 11:
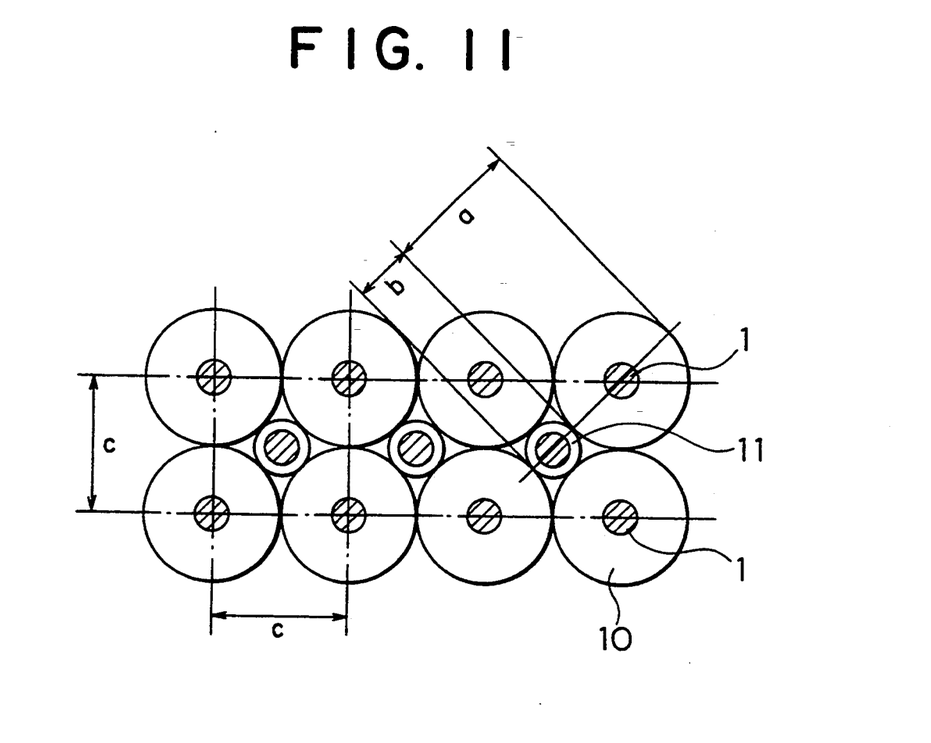
FIG. 11 is a schematic diagram showing an alignment pitch of the wire materials.

In this embodiment, the alignment pitch of the micropins is set to 400 μm, hence the thicker electrically insulating coating 2 has a thickness of 150 μm as illustrated in FIG. 11. This value is calculated according to the following formula (pitch C -diameter of pin)/2, taking account of the diameter of the micropin 1, e.g., $$T_1 = (C-R)/2$$

wherein C represents a pitch of said plurality of micropins of the columns and R represents a diameter of said plurality of micropins of the columns, and each of said second insulating coatings has a thickness $T_2$ calculated using the following equation. On the other hand, the thinner electrically insulating coating 3 has a thickness of 32 μm. As illustrated in FIG. 11, this value is calculated according to the following formula pitch $C \times \sqrt{2}$-diameter of micropin-thickness of electrically insulating coating 2, in order to align the micropins in the staggered lattice, e.g., $$T_2 = \{\sqrt{2}C - 2(R+T_1)\}/2$$

wherein C, R and $T_1$ are as defined above.

Returning to FIG. 2, the respective electrically insulating coatings 2 and 3 enclosing the micropins 1 are fixed together by means of adhesive 4. This adhesive 4 is preferably composed of a specific material selected such that the adhesive shrinks slightly during the course of curing so as to closely fix the electrically insulating coatings 2 and 3 of the micropins 1 with each other in order to accurately set the alignment pitch solely by the dimension or thickness of the electrically insulating coatings 2 and 3. Further, the adhesive 4 should have excellent durability in order to avoid aging change of the alignment pitch of the micropins 1. Moreover, the adhesive 4 should have a good thermal resistance effective to withstand for a thermal treatment after the curing, during the course of assembling of the micropin array 5 with an LSI chip. In view of these needed characteristics, the adhesive may be composed, for example, of polyimide resin, maleimide resin or denatured epoxy resin.

Figure 4:
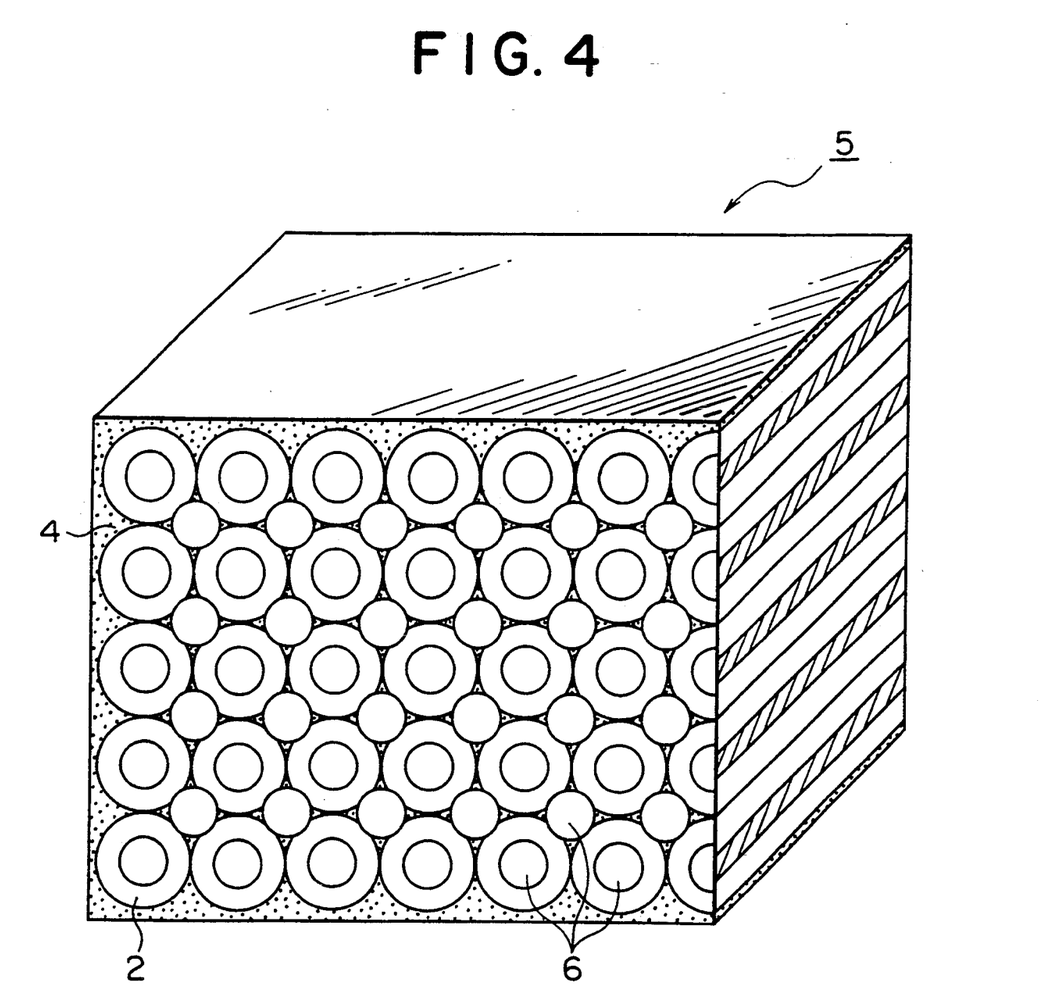
FIG. 4 is a perspective view of the FIG. 2 micropin array added with pads.
Figure 5:
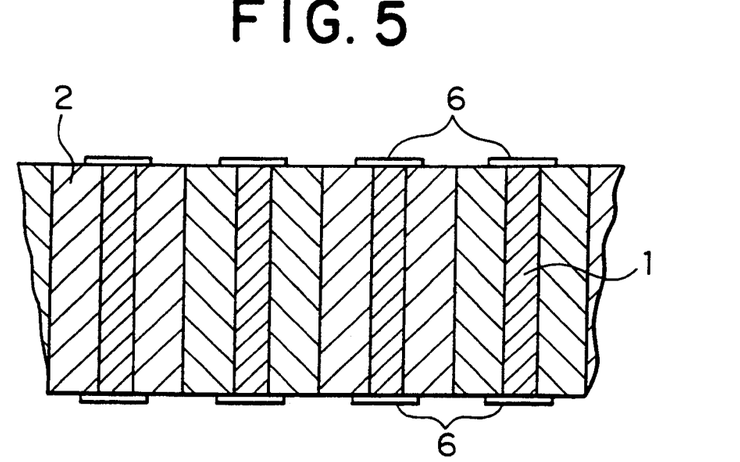
FIG. 5 is a vertical side section of the FIG. 4 micropin array.

FIG. 4 is a perspective view containing a section showing arrangement of pads 6 formed on opposite ends of the micropin array 5 of FIGS. 2 and 3 for electrical connection, and FIG. 5 is a vertical side section of FIG. 4 when viewed from the side direction.

The pad 6 is formed from a thin film composed of copper, gold and so on, by photolithographic technology such that the pad has a disc shape of 150 μm diameter and 10 μm thickness.

Figure 6:
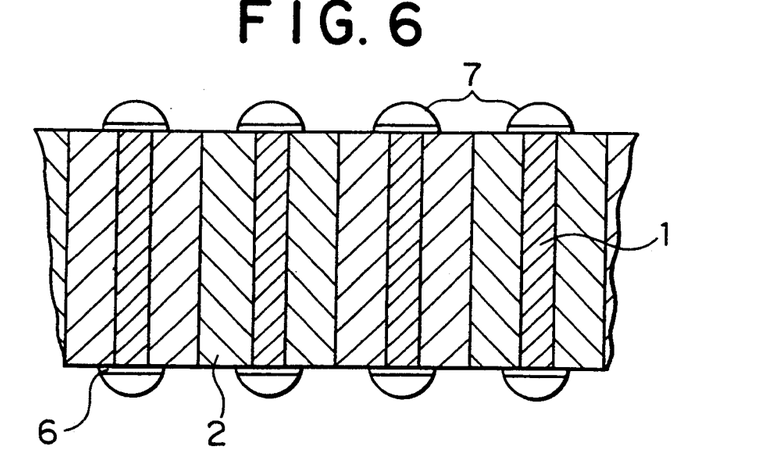
FIG. 6 is a vertical side section of the FIG. 4 micropin array added with solder material.

Referring to FIG. 6, in preparation for coupling to LSI chip, the pads 6 disposed on the ends of the FIG. 5 micropin array is clad with a solder material 7 composed of Au-Sn eutectic alloy having composition of 80/20 wt % and having a melting point of 280° C. The solder material 7 may be composed of other clad alloy such as gold-germanium solder (88/12 wt %) and gold-silicon alloy (94/6 wt %). In general cladding process of a solder material to I/O pins in typical PGA, firstly a pellet of the Au-Sn alloy is formed such that its weight is calculated according to a header size of the pin. For example, if a pin header is formed in the size of 0.7–0.8 mm on the pin having diameter of 0.3–0.5 mm, the Au-Sn pellet should have the weight of 0.7–1.0 mg. Then, the pellet is placed on the pin header to thereby carry out reflow processing. However, in case of treatment of a small size pin, i.e., micropin, it might be difficult in view of handling of micropins and tiny solder material pellets to clad accurately a tiny amount of Au-Sn alloy of about 0.1 mg calculated according to the micropin size onto the pin header without substantial variation. In view of this, cladding of Au-Sn solder material 7 over the micropin array 5 can be alternatively effected by metallization with using photolithographic technology in manner similar to the formation of the pads 6 on the end surface of micropin array 5. Namely, a gold film and a tin film are applied over the pads 6 while controlling their film thickness to set weight ratio of Au/Sn=80/20. Stated otherwise, gold metallization and tin metallization are carried out to set volume ratio of Au/Sn=1.55. Then, the metallized gold and tin are subjected to reflow treatment to form an eutectic alloy of Au-Sn to thereby clad the solder material 7. In such case, if a single layer of the metallized gold is superposed on another single layer of the metallized tin, eutectic reaction may occur locally only along a boundary therebetween, thereby failing to form uniform eutectic alloy composition in the solder material. In view of this, it might be preferable to repeatedly laminate alternately thin films of gold and tin to form a multi-layer structure which is then subjected to the reflow process. In such case, the gold thin film is metallized at thickness of, for example, 1 μm, and the tin thin film is metallized at thickness of 0.7 μm.

Figure 7:
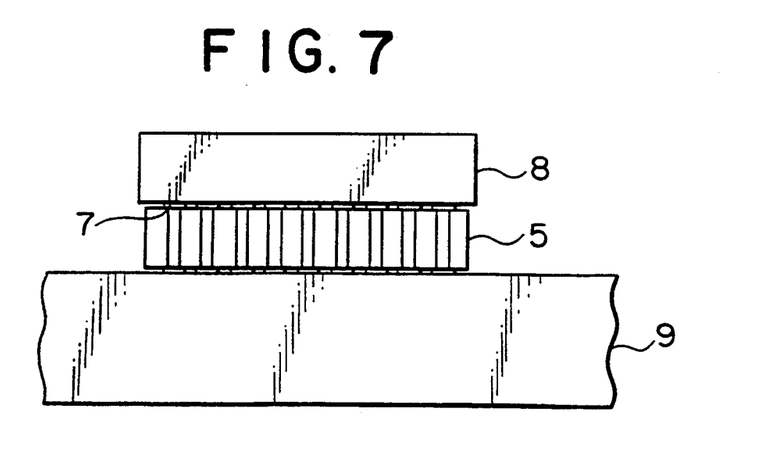
FIG. 7 is a side view-showing an assembly of an IC chip and a circuit substrate connected to each other by the FIG. 6 micropin array.

FIG. 7 shows a complete assembly in which an LSI chip 8 is mounted on a substrate 9 with using the thus produced micropin array 5.

Figure 8:
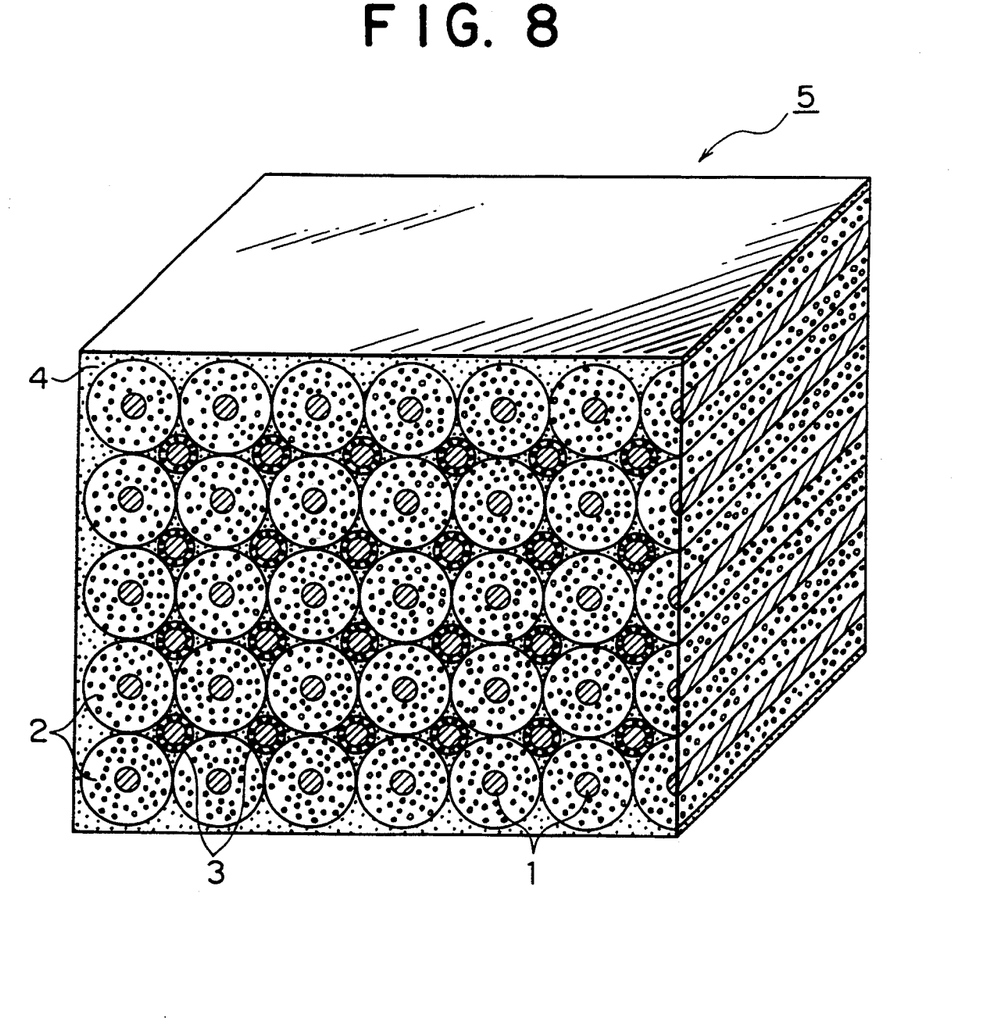
FIG. 8 is a perspective view containing a section of a further embodiment of the invention.
Figure 9:
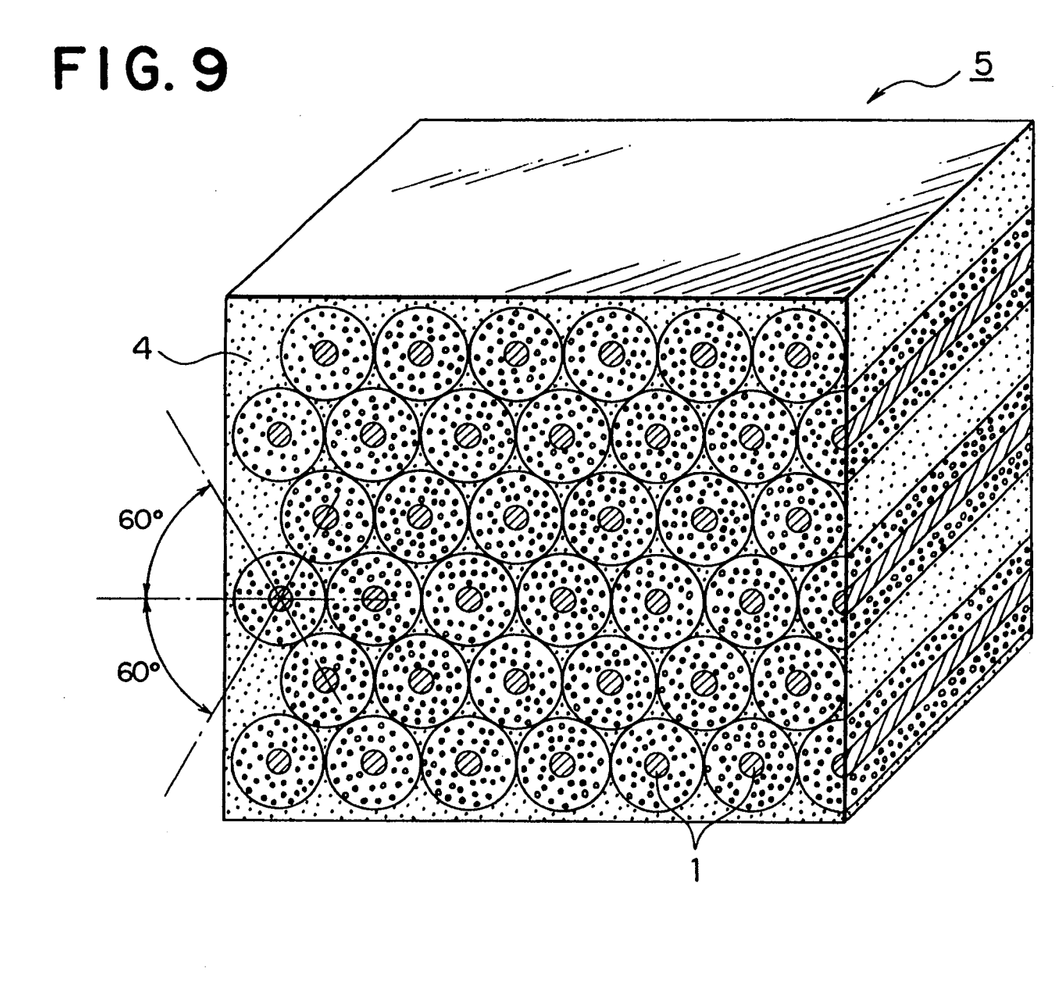
FIG. 9 is a perspective view containing a section of a still further embodiment of the invention.

FIGS. 8 and 9 show modified micropin arrays in which the respective micropins 1 are surrounded by the electrically insulating tubular coatings 2 and 3 composed of a porous material such as foam of Teflon resin. Using of the porous insulating coatings can reduce a net dielectric constant to increase a signal transmission speed through the micropin array.

Figure 10:
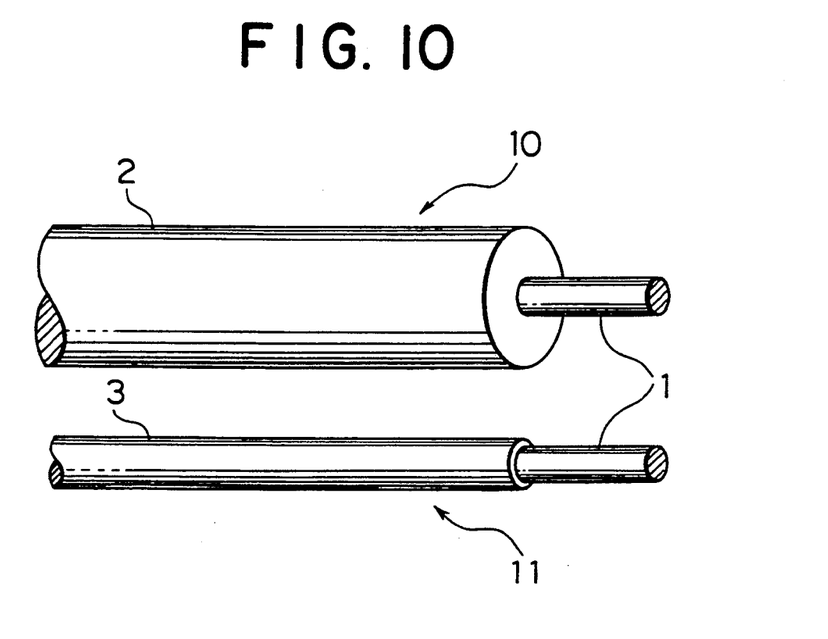
FIG. 10 is a schematic diagram showing examples of wire materials used in the embodiments of the invention.

Hereinafter, the description is given for the method of producing the inventive micropin array with reference to the drawings, in which the array is formed, as an example, of a staggered lattice having 100 μm of pin diameter and 400 μm of alignment pitch. FIG. 10 shows two kinds of coated wire materials 10 and 11 having different insulating coating thicknesses for use in the production of the inventive micropin array. The coated wire materials 10 and 11 have a core 1, i.e., micropin 1 composed, for example, of a single copper wire which is coated by either of thicker and thinner polyimide resins 2 and 3. The coated wire material 10 has 400 μm of diameter, and the other coated wire material 11 has 164 μm of diameter. Since the copper core has 100 μm of diameter, the thicker polyimide coating 2 has 150 μm of thickness, and the other thinner polyimide coating 3 has 32 μm of thickness. As illustrated in FIG. 11, the core diameter and the coating thickness are determined according to a pin diameter of the objective micropin array and the alignment pitch C of the micropins. Namely, the diameter a of the coated wire material 10 is set identical to the pitch C of the micropin array, and the diameter b of the other coated wire material 11 is calculated accordingly.

Figure 12:
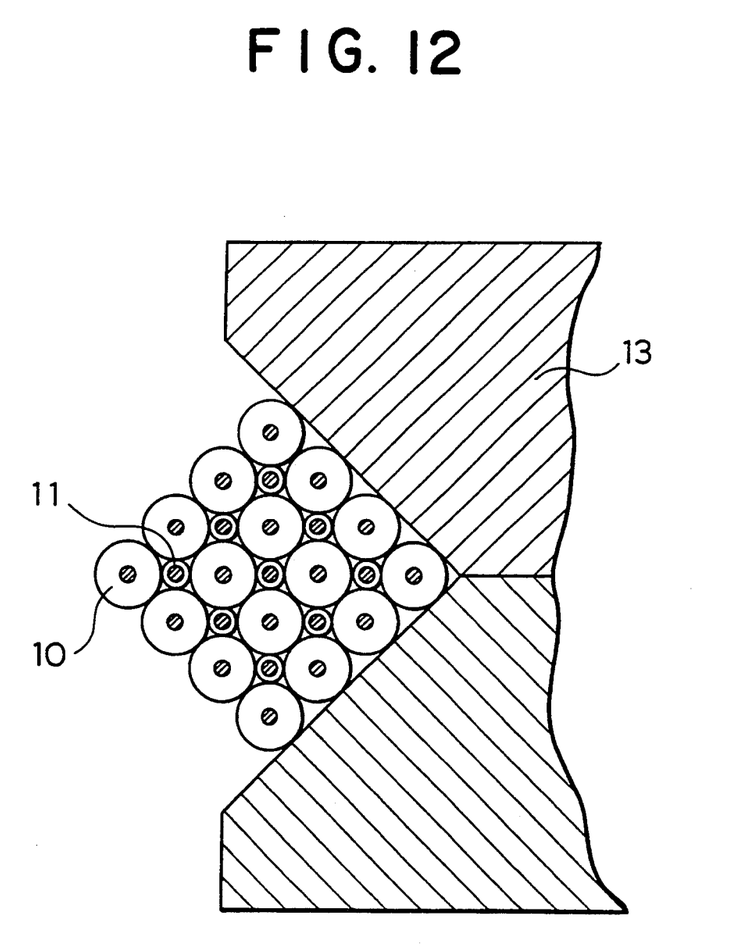
FIG. 12 is a sectional view showing one step of producing the inventive micropin array with using a support tool.

Referring to FIG. 12, the coated wire materials 10 and 11 are alternately aligned with one another. More specifically referring to FIG. 13, a winding tool 13 having centrally a gap is utilized to wind therearound the coated wire materials 10 and 11 as indicated by the arrow such that the wire materials are regularly and closely aligned with one another. This winding tool 13 is provided with a recess having a V-shaped section of angle 90°. The wire materials are sequentially wound along the annular recess from the bottom to the top of the V-shaped recess.

Figure 13:
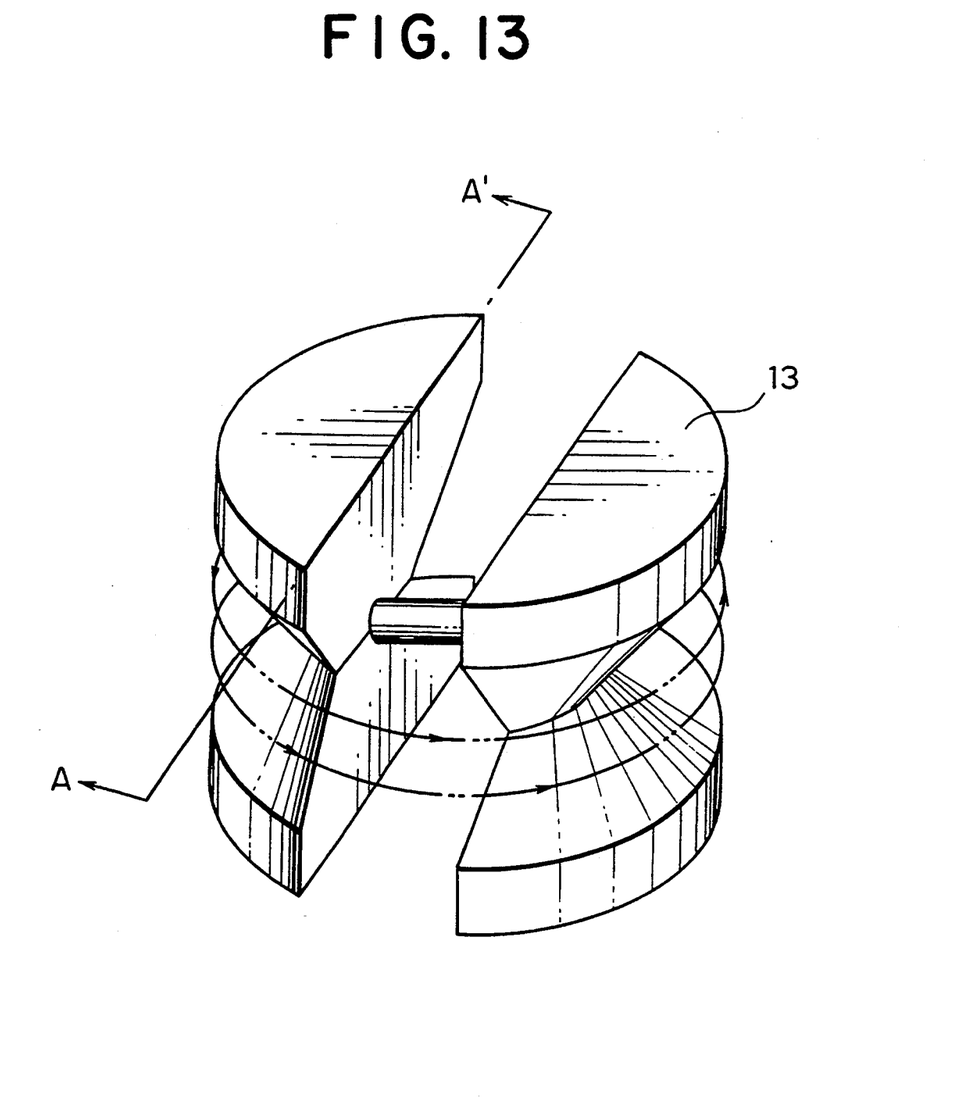
FIG. 13 is a perspective view showing that tool.
Figure 14:
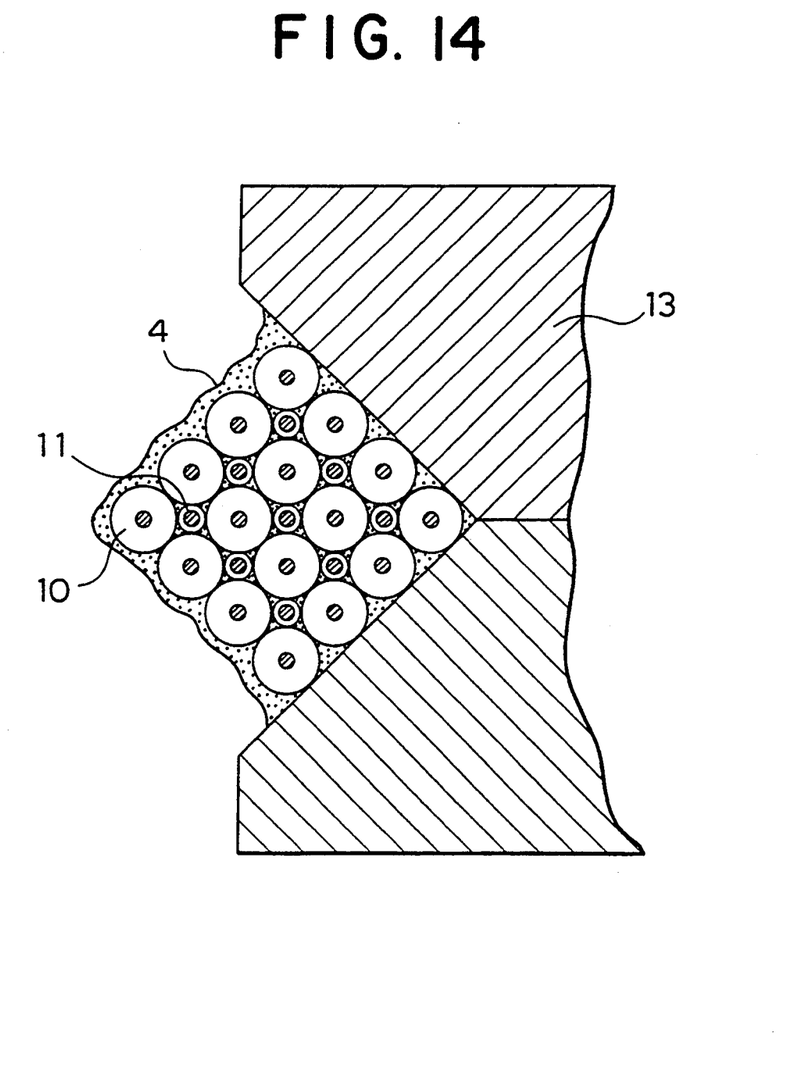
FIG. 14 is a sectional view showing another step of producing the inventive micropin array with the aid of the support tool.

Referring to FIG. 14 which is a sectional view taken along the line A-A' of FIG. 13, the wound wire materials 10 and 11 are fixed by means of an adhesive while being supported by the tool 13. In this case, the tool is coated provisionally on its surface with a release agent such that the bundle of the wire materials can be easily removed from the tool 13 after the curing of the adhesive. The adhesive should have sufficient electric reliability after curing and high fluidity effective to sufficiently flow into spacings between the coated wire materials.

Figure 15:
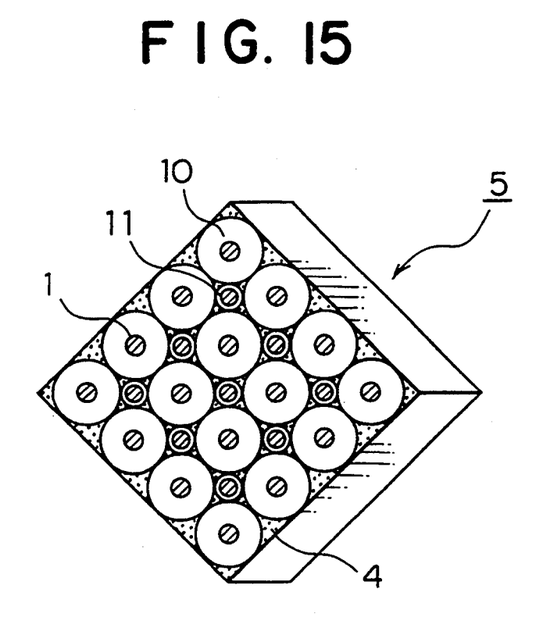
FIGS. 15 and 16 are perspective views showing different embodiments of the present invention.
Figure 16:
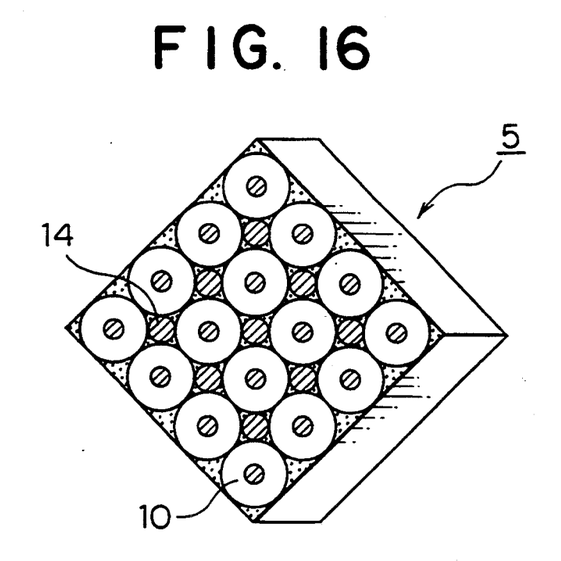

Referring to FIG. 15, a micropin array 5 is cut out by a given length from the fixed or molded bundle of the coated wire materials wound around the tool 13, selectively from its straight portion which extends over the gap provided in the tool 13. The cut micropin array 5 is then polished. Alternatively referring to FIG. 16, when aligning the pins in a square lattice, instead of the coated wire material 11, an insulating string such as a polyimide balk string 14 having the same diameter as that of the coated wire material 11 is inserted among the adjacent coated wire materials 10. Further in case of producing a micropin array in which the micropins are aligned at an angle of 60° with respect to adjacent micropins, there are utilized coated wire materials 10 and 11 having the same diameter.

In addition, the electrically insulating coating may be composed of a porous material such as foam of Teflon resin so as to reduce a net dielectric constant of the array matrix to thereby increase a signal transmission speed through micropins.

As described above, the inventive method of producing the micropin array is based on the technique that coated wire materials having desired natures and diameter are wound sequentially so as to align micropins at a given pitch. Thereafter, the bundle of the coated wire materials is molded or impregnated by an adhesive, and then is cut to form a micropin array.

By such method, there can be produced an improved micropin array having a high aspect ratio, i.e., pin length/pin diameter ratio more than 20, which could not be realized by the typical mechanical working of pin such as stamping. Further, the thus produced micropin array can simplify later assembling process and can improve the mechanical strength of the assembled micropins.

According to the present invention, wire materials having electrically insulating coatings are successively superposed to align with one another to form a bundle of the coated wire materials. This bundle is fixed by an adhesive and then is cut to produce a micropin array. The thus produced micropin array features advantageously fine pin diameter, close pin alignment pitch and high aspect ratio.

What is claimed is:
1. A micropin array including,
   a plurality of micropins arranged in parallel to one another,
   insulating coatings provided to cover individual micropins, and
   an adhesive provided to fill spacings among said insulating coatings,
   wherein three center points of cross sections of adjacent three micropins covered with said insulating coatings are positioned at respective vertices of an equilateral triangle.
2. The micropin array according to claim 1, wherein said insulating coatings are composed of a porous material.
3. A micropin array comprising:
   a plurality of adjacent micropins arranged in a column-like manner at a given pitch and in parallel to one another;
   additional micropins each being surrounded by four adjacent micropins in said columns such that a center point of a cross section of each additional micropin is positioned on a center point of a square shape which is formed by connecting four center points of cross sections of said four adjacent micropins;
   first insulating coatings provided to cover said plurality of adjacent micropins;
   second insulating coatings provided to cover said additional micropins; and
   an adhesive provided to fill spacings among said first and second insulating coatings.
4. The micropin array according to claim 3, wherein each of said first insulating coatings has a thickness $T_1$ calculated using the following equation:

$$T_1 = (C-R)/2$$

wherein C represents a pitch of said plurality of micropins of the columns and R represents a diameter of said plurality of micropins of the columns, and each of said second insulating coatings has a thickness $T_2$ calculated using the following equation;

$$T_2 = \{\sqrt{2}C - 2(R+T_1)\}/2$$

wherein C, R and $T_1$ are as defined above.
5. The micropin array according to claim 3, wherein at least one of said first insulating coatings and said second insulating coatings is composed of a porous material.

* * * * *